(12) United States Patent
Gasse et al.

(10) Patent No.: US 11,049,762 B2
(45) Date of Patent: Jun. 29, 2021

(54) ELECTRONIC CIRCUIT COMPRISING ELECTRICAL INSULATION TRENCHES

(71) Applicant: Commissariat à l'Énergie Atomique et aux Énergies Alternatives, Paris (FR)

(72) Inventors: Adrien Gasse, Seyssins (FR); Sylvie Jarjayes, Sassenage (FR); Marion Volpert, Sassenage (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/464,121

(22) PCT Filed: Nov. 23, 2017

(86) PCT No.: PCT/FR2017/053240
§ 371 (c)(1),
(2) Date: May 24, 2019

(87) PCT Pub. No.: WO2018/100273
PCT Pub. Date: Jun. 7, 2018

(65) Prior Publication Data
US 2019/0393075 A1     Dec. 26, 2019

(30) Foreign Application Priority Data
Nov. 29, 2016 (FR) ........................ 1661611

(51) Int. Cl.
*H01L 21/762*  (2006.01)
*H01L 21/02*   (2006.01)
(Continued)

(52) U.S. Cl.
CPC .. *H01L 21/76224* (2013.01); *H01L 21/02532* (2013.01); *H01L 21/76283* (2013.01);
(Continued)

(58) Field of Classification Search
CPC ......... H01L 21/76224; H01L 21/02532; H01L 21/76283; H01L 21/76898; H01L 24/80;
(Continued)

(56) References Cited

U.S. PATENT DOCUMENTS

2002/0081809 A1* 6/2002 Pinto ................. H01L 21/76264
                                                                 438/296
2012/0153430 A1* 6/2012 Bachman .......... H01L 21/76224
                                                                 257/508
(Continued)

FOREIGN PATENT DOCUMENTS

EP       2 466 634 A1    6/2012

OTHER PUBLICATIONS

International Preliminary Report on Patentability for International Application No. PCT/FR2017/053240, dated Jun. 13, 2019.
(Continued)

*Primary Examiner* — Ahmed N Sefer
(74) *Attorney, Agent, or Firm* — Wolf, Greenfield & Sacks, P.C.

(57) ABSTRACT

An electronic circuit including a semiconductor substrate having first and second opposite surfaces and electrically-insulating trenches. Each trench includes at least first and second insulating portions made of a first insulating material, extending from the first surface to the second surface, first and second intermediate portions, extending from the first surface to the second surface, made of a first filling material, and a third insulating portion extending from the first surface to the second surface, the first insulating portion being in contact with the first intermediate portion, the second insulating portion being in contact with the second intermediate portion, and the third insulating portion being interposed between the intermediate portions.

10 Claims, 4 Drawing Sheets

(51) Int. Cl.
*H01L 21/768* (2006.01)
*H01L 23/00* (2006.01)
*H01L 25/065* (2006.01)

(52) U.S. Cl.
CPC ........ *H01L 21/76898* (2013.01); *H01L 24/80* (2013.01); *H01L 25/0657* (2013.01); *H01L 2224/80001* (2013.01); *H01L 2225/06541* (2013.01)

(58) Field of Classification Search
CPC ....... H01L 25/0657; H01L 2224/80001; H01L 2225/06541
See application file for complete search history.

(56) References Cited

U.S. PATENT DOCUMENTS

| | | |
|---|---|---|
| 2012/0153492 A1 | 6/2012 | Bachman et al. |
| 2013/0020719 A1* | 1/2013 | Jung ................... H01L 25/0657 257/774 |
| 2015/0118823 A1 | 4/2015 | Nier et al. |

OTHER PUBLICATIONS

PCT/FR2017/053240, Apr. 26, 2018, International Search Report and Written Opinion.
PCT/FR2017/053240, Jun. 13, 2019, International Preliminary Report on Patentability.
International Search Report and Written Opinion for International Application No. PCT/FR2017/053240, dated Apr. 26, 2018.

* cited by examiner

ELECTRONIC CIRCUIT COMPRISING ELECTRICAL INSULATION TRENCHES

This application is a national stage filing under 35 U.S.C. 371 of International Patent Application Serial No. PCT/FR2017/053240, filed Nov. 23, 2017, which claims the priority to French patent application FR16/61611, filed Nov. 29, 2016. The entire contents of these applications are incorporated herein by reference in their entirety.

BACKGROUND

The present application concerns an electronic circuit comprising electric insulation trenches.

DISCUSSION OF THE RELATED ART

Generally, an electronic circuit comprises a semiconductor substrate having electronic components formed inside and on top of it. For certain applications, it is desirable to electrically insulate different portions of the semiconductor substrate from one another. This can be obtained by forming in the substrate electrically-insulating trenches which extend across the entire thickness of the substrate and which divide the substrate into portions electrically insulated from one another.

FIGS. 1 and 2 are cross-section views of an example of an electronic circuit 5. FIG. 1 is a cross-section view of FIG. 2 along line I-I and FIG. 2 is a cross-section view of FIG. 1 along line II-II. Electronic circuit 5 comprises a semiconductor substrate 6 having opposite surfaces 8, 10 and further comprises, in substrate 6, criss-cross electric insulation trenches 12, 14 which delimit portions 16 of substrate 6. Electronic components 17, schematically shown in FIGS. 1 and 2 by rectangles, are formed in portions 16 and/or on portions 16. These are for example metal-oxide gate field effect transistors (MOS transistors), diodes, light-emitting diodes, or photodiodes.

Trenches 12 extend in top view along a first direction and trenches 14 extend in top view along a second direction inclined with respect to the first direction, for example, perpendicular to the first direction. Trenches 12, 14 have substantially the shape of strips in top view. Trenches 12, 14 extend in substrate 6 from surface 8 across part of or the entire thickness of substrate 6.

As an example, each trench 12, 14 comprises two substantially planar opposite lateral walls 18A, 18B, for example, substantially parallel, covered with an electrically-insulating portion 19A, 19B of thickness $E_{ox1}$, measured in a plane parallel to surface 8, core 20 of trench 12, 14 being filled with a filling material, for example, a semiconductor material. Insulating portion 19A, 19B may have a substantially constant thickness. As a variation, the thickness of insulating portion 19A, 19B may be non-constant. In this case, thickness $E_{ox1}$ corresponds to the minimum thickness of insulating portion 19A, 19B. Call lateral dimension E, or also, indifferently, width or thickness, of trench 12, 14, the distance between the two lateral walls 18A, 18B. As a variation, lateral walls 18A, 18B may be substantially inclined with respect to each other, lateral walls 18A, 18B for example coming closer to each other as their distance to surface 8 increases. In this case, thickness E of trench 12, 14 corresponds to the average distance separating the two lateral walls 18A, 18B.

Electronic circuit 5 further comprises an electrically-insulating layer 22 or a stack of electrically-insulating layers on surface 8 and an electrically-insulating layer 24 or a stack of electrically-insulating layers on surface 10. Contact pads, not shown, may be provided on the side of surface 10, through insulating layer 24 in contact with portions 16 of the substrate.

Thickness E and thickness $E_{ox1}$ are determined according to the voltage behavior desired for trench 12, 14, that is, the minimum voltage, called breakdown voltage, applied between two adjacent portions 16 of substrate 6 for which trench 12, 14 becomes electrically conductive. Dimensions E and $E_{ox1}$ are generally determined by simulation. According to the targeted applications, trenches 12, 14 should withstand voltages which may be greater than 100 V, or even than several hundred volts, for example, 500 V.

A possibility to increase the breakdown voltage of trench 12, 14 would be to increase thickness $E_{ox1}$ of insulating portion 19A, 19B. However, when thickness $E_{ox1}$ increases, mechanical stress appears in circuit 5, particularly due to the expansion coefficient of the insulating material forming insulating portions 19A, 19B, which is different from the expansion coefficient of the adjacent materials.

It would be desirable to increase the breakdown voltage of trench 12, 14 without increasing thickness $E_{ox1}$ of insulating portion 19A, 19B.

SUMMARY

An object of an embodiment is to provide an electronic circuit comprising electric insulation trenches overcoming all or part of the disadvantages of existing trenches.

Another object of an embodiment is to increase the breakdown voltage of electric insulation trenches.

Another object of an embodiment is for the method of manufacturing electric insulation trenches to comprise a reduced number of additional steps as compared with a method of manufacturing conventional electric insulation trenches.

Thus, an embodiment provides an electronic circuit comprising a semiconductor substrate having first and second opposite surfaces and electric insulation trenches extending in the substrate from the first surface to the second surface, each trench separating first and second portions of the substrate, each trench comprising:

at least first and second electrically-insulating portions of a first electrically-insulating material extending from the first surface to the second surface, first and second intermediate portions, extending from the first surface to the second surface, made of a first filling material different from the first electrically-insulating material, and a third electrically-insulating portion extending from the first surface to the second surface, made of the first electrically-insulating material or of a second electrically-insulating material different from the first electrically-insulating material, the first electrically-insulating portion being in contact with the first intermediate portion, the second electrically-insulating portion being in contact with the second intermediate portion, and the third electrically-insulating portion being interposed between the first and second intermediate portions.

According to an embodiment, each trench further comprises:

a fourth electrically-insulating portion, extending from the first surface to the second surface, made of the same material as the third electrically-insulating portion, and at least a third intermediate portion, extending from the first surface to the second surface, made of the first filling material or of a second filling material different from the first filling material, the third electrically-insulating portion being in contact with the first intermediate portion, the fourth electrically-insulating portion being in contact with the second intermediate portion and the third intermediate portion being interposed between the third and fourth electrically-insulating portions.

According to an embodiment, each trench further comprises:

a fourth intermediate portion, extending from the first surface to the second surface, made of the same material as the third intermediate portion, and at least a fifth electrically-insulating portion, extending from the first surface to the second surface, made of the first electrically-insulating material, of the second electrically-insulating material, or of a third electrically-insulating material different from the first and second electrically-insulating material, the third intermediate portion being in contact with the third electrically-insulating portion, the fourth intermediate portion being in contact with the fourth electrically-insulating portion, and the fifth electrically-insulating portion being interposed between the third and fourth intermediate portions.

According to an embodiment, the first electrically-insulating material is selected from the group comprising silicon oxide, silicon nitride, silicon oxynitride, or is a material having a dielectric constant smaller by at least 30% than the dielectric constant of silicon oxide, particularly fluorine-doped silicon dioxide, carbon-doped silicon dioxide, porous silicon dioxide, or porous carbon doped silicon dioxide.

According to an embodiment, the first filling material is selected from the group comprising silicon, germanium, silicon carbide, III-V compounds, II-VI compounds, tungsten, copper, oxide glasses, organic-based materials, or a mixture of at least two of these compounds.

According to an embodiment, the trenches delimit rows of portions of the substrate.

According to an embodiment, the thickness of the substrate is in the range from 2 µm to 500 µm.

According to an embodiment, the thickness of the first, second, and third electrically-insulating portions is in the range from 10 nm to 500 nm.

According to an embodiment, the thickness of the first and second intermediate portions is in the range from 235 nm to 2,000 nm.

An embodiment also provides a method of manufacturing an electronic circuit, comprising the successive steps of:

providing a semiconductor substrate having first and second opposite surfaces;

forming openings in the substrate from the first surface across part of the substrate thickness;

depositing a first electrically-insulating layer of a first electrically-insulating material at least in each opening;

depositing a first intermediate layer of a first filling material different from the first electrically-insulating material at least in each opening in contact with the first electrically-insulating layer;

depositing a second electrically-insulating layer of the first electrically-insulating material or of a second electrically-insulating material different from the first electrically-insulating material at least in each opening in contact with the first intermediate layer; and thinning the substrate from the second surface to bring the second surface closer to the first surface to reach at least the second electrically-insulating layer, thus delimiting electric insulation trenches extending in the substrate from the first surface to the second surface, each trench separating first and second portions of the substrate, each trench comprising at least first and second electrically-insulating layers made of the first electrically-insulating material extending from the first surface to the second surface, first and second intermediate layers, extending from the first surface to the second surface, made of the first filling material, and a third electrically-insulating layer extending from the first surface to the second surface, made of the first electrically-insulating material or of the second electrically-insulating material, the first electrically-insulating layer being in contact with the first intermediate layer, the second electrically-insulating layer being in contact with the second intermediate layer, and the third electrically-insulating layer being interposed between the first and second intermediate layers.

According to an embodiment, the method further comprises, before the thinning step, depositing a second intermediate layer made of the first filling material or of a second filling material different from the first filling material, at least in each opening in contact with the second electrically-insulating layer, each trench delimited at the thinning step further comprising a fourth electrically-insulating portion, extending from the first surface to the second surface, made of the same material as the third electrically-insulating portion and at least one third intermediate portion, extending from the first surface to the second surface, made of the first filling material or of the second filling material, the third electrically-insulating portion being in contact with the first intermediate portion, the fourth electrically-insulating portion being in contact with the second intermediate portion, and the third intermediate portion being interposed between the third and fourth electrically-insulating portions.

According to an embodiment, the method further comprises, before the thinning step, depositing a third electrically-insulating layer made of the first electrically-insulating material, of the second electrically-insulating material, or of a third electrically-insulating material different from the first and second electrically-insulating materials, at least in each opening, in contact with the second intermediate layer, each trench delimited at the thinning step further comprising a fourth intermediate portion, extending from the first surface to the second surface, made of the same material as the third intermediate portion, and at least a fifth electrically-insulating portion extending from the first surface to the second surface, made of the first electrically-insulating material, of the second electrically-insulating material, or of the third electrically-insulating material, the third intermediate portion being in contact with the third electrically-insulating portion, the fourth intermediate portion being in contact with the fourth electrically-insulating portion, and the fifth electrically-insulating portion being interposed between the third and fourth intermediate portions.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
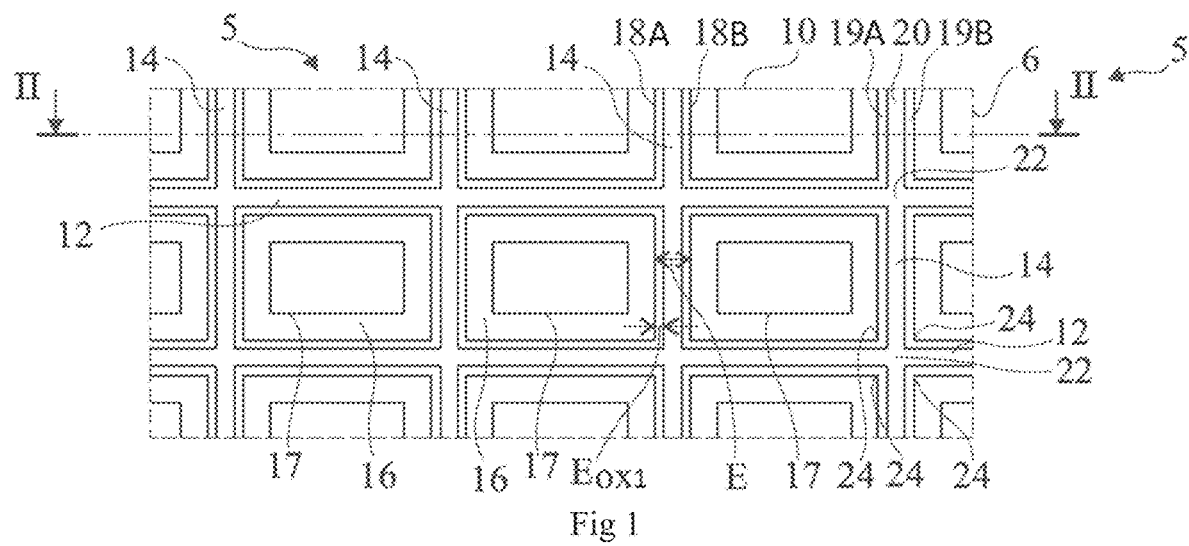
FIGS. 1 and 2, previously described, are partial simplified cross-section views of an example of an electronic circuit comprising electric insulation trenches.

The same elements have been designated with the same reference numerals in the different drawings. Further, as usual in the representation of integrated circuits, the drawings are not to scale. For clarity, only those elements which are useful to the understanding of the described embodiments have been shown and are detailed. In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the drawings. The terms "approximately", "substantially", "about", and "in the order of" are used herein to designate a tolerance of plus or minus 10%, preferably of plus or minus 5%, of the value in question. In the following description, a material having a resistivity greater than $10^3$ $\Omega \cdot m$ is called "electrically-insulating material" and a material having an electric resistivity in the range from 0.1 $\Omega \cdot m$ and $10^3$ $\Omega \cdot m$ is called "semiconductor material".

According to an embodiment, each electric insulation trench is formed of a succession of electrically-insulating portions, extending between the two surfaces of the substrate, alternated with filling portions, also called intermediate portions, extending between the two surfaces of the substrate, each filling portion being sandwiched between two insulating portions. An electric insulation trench comprises at least three insulating portions and two filling portions. The breakdown voltage of the trench is thus increased. From each lateral wall 18A, 18B, the trench thus successively comprises an insulating portion, a filling portion, an insulating portion, etc. Numbering each insulating portion from each lateral wall of the trench to the center of the trench, the insulating portions of same rank are made of the same insulating material. Similarly, numbering each filling portion from each lateral wall of the trench to the center of the trench, the filling portions of same rank are made of the same filling material.

Figure 2:
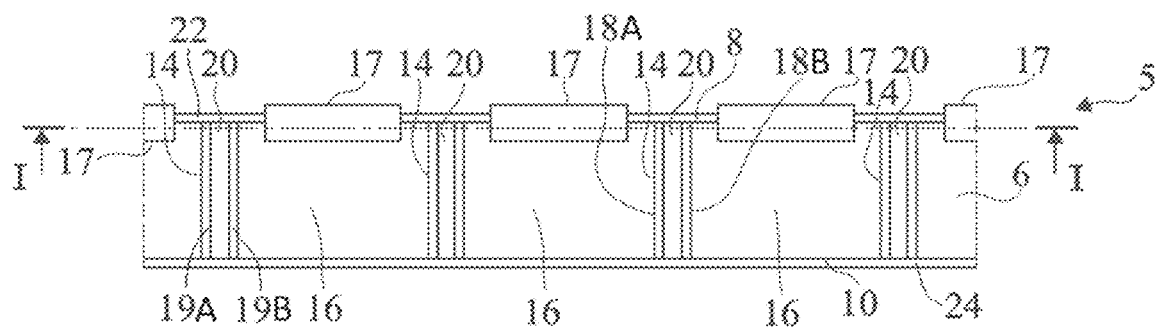
Figure 3:
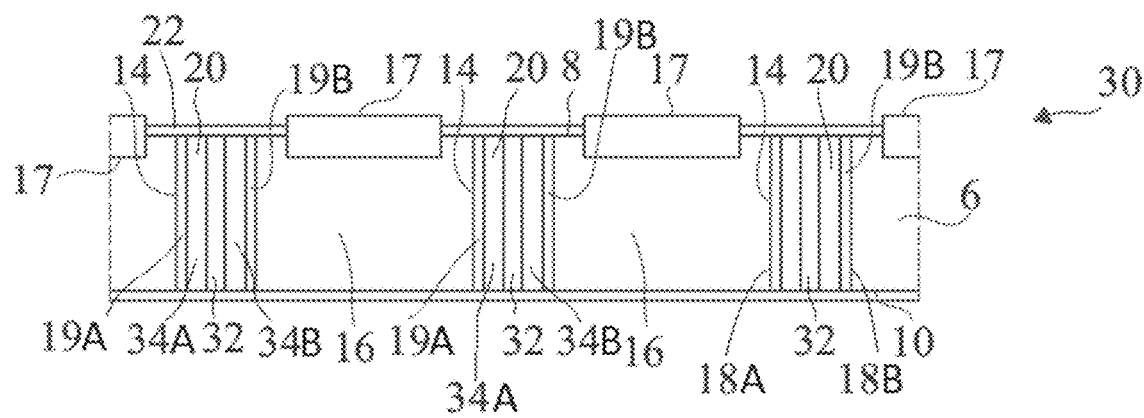
FIGS. 3, 4 and 5 are partial simplified cross-section views of embodiments of electronic circuits comprising electric insulation trenches.

FIG. 3 is a view similar to FIG. 2 and shows an embodiment of an electronic circuit 30 where each trench comprises three electrically-insulating portions. Electronic circuit 30 comprises all the elements of electronic circuit 5 shown in FIG. 2, each trench 12, 14 further comprising an electrically-insulating portion 32 located between insulating portions 19A, 19B and extending from surface 8 to surface 10. Portion 32 delimits portions 34A, 34B of a filling material, portion 34A being located between insulating portion 19A and insulating portion 32, in contact with insulating portion 19A and with insulating portion 32, and portion 34B being located between insulating portion 19B and insulating portion 32, in contact with insulating portion 19B and insulating portion 32. The two portions 34A, 34B are made of a same material different from the material of substrate 6, particularly by the method by which it is obtained.

Figure 4:
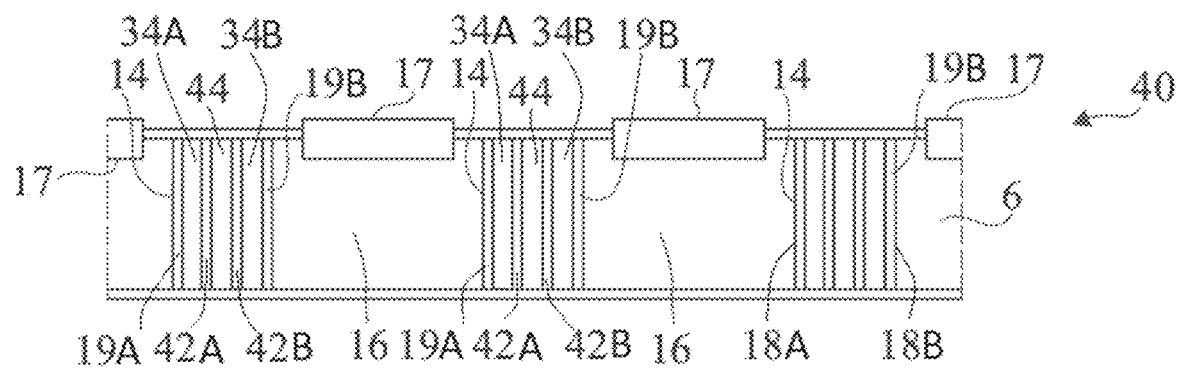

FIG. 4 is a view similar to FIG. 2 and shows an embodiment of an electronic circuit 40 where each trench comprises four electrically-insulating portions. Electronic circuit 40 comprises all the elements of electronic circuit 5 shown in FIG. 2, each trench 12, 14 further comprising electrically-insulating portions 42A, 42B located between portions 34A, 34B of the filling material and extending from surface 8 to surface 10, insulating portion 42A being in contact with portion 34A and insulating portion 42B being in contact with portion 34B. Portions 42A, 42B delimit a filling portion 44, located between insulating portion 42A and insulating portion 42B and in contact with insulating portions 42A and 42B. Portion 44 is made of a second filling material which may be identical to or different from the first filling material.

Figure 5:
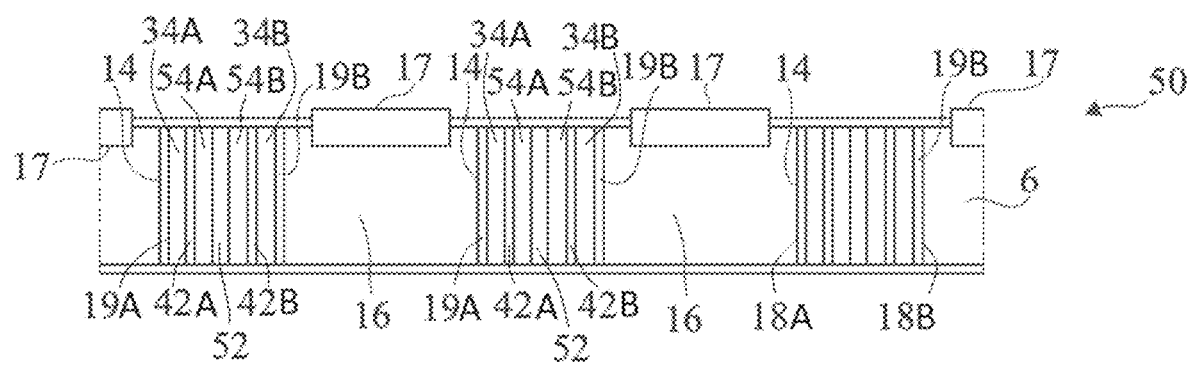

FIG. 5 is a view similar to FIG. 4 and shows an embodiment of an electronic circuit 50 where each trench comprises five electrically-insulating portions. Electronic circuit 50 comprises all the elements of the electronic circuit 40 shown in FIG. 4, each trench 12, 14 further comprising an electrically-insulating portion 52 located between insulating portions 42A and 42B and extending from surface 8 to surface 10. Insulating portion 52 delimits filling portions 54A, 54B, portion 54A being located between insulating portion 42A and insulating portion 52, in contact with insulating portions 42A and 52, and portion 54B being located between insulating portion 42B and insulating portion 52, in contact with insulating portions 52 and 42B. The two portions 54A and 54B are made of a same filling material, identical or different from the following material forming portions 34A and 34B.

The thickness E of each trench 12, 14 is in the range from 0.5 µm to 10 µm, for example, approximately 2 µm. The ratio of the thickness E of each trench 12, 14 to the thickness of substrate 6 is smaller than 50, preferably smaller than 30. The thickness of each insulating portion 19A, 19B, 32, 42A, 42B, 52 measured in a plane parallel to surface 8, is in the range from 10 to 2,000 nm, preferably from 100 to 600 nm, for example, approximately 200 nm. The ratio of the thickness of each insulating portion 19A, 19B, 32, 42A, 42B, 52 to the thickness of each trench 12, 14 is smaller than 0.2, preferably than 0.1. The thickness of each filling portion 34A, 34B, 44, 54A, 54B, measured in a plane parallel to surface 8, is in the range from 235 nm to 2,000 nm, preferably from 500 nm to 1,000 nm, for example, approximately 750 nm. The thickness of substrate 6 is in the range from 2 µm to 500 µm, for example, approximately 60 µm, at the end of the optoelectronic circuit manufacturing method.

Substrate 6 may correspond to a monoblock structure or to a layer covering a support made of another material. Substrate 6 is preferably a semiconductor substrate, for example, a substrate made of silicon, of germanium, of silicon carbide, of a III-V compound, such as GaN or GaAs, or a ZnO substrate. Preferably, substrate 6 is a single-crystal silicon substrate. Preferably, it is a semiconductor substrate compatible with manufacturing methods implemented in microelectronics. Substrate 6 may correspond to a multi-layer structure of silicon-on-insulator type, also called SOI. Substrate 6 may be heavily doped, lightly-doped, or non-doped.

Each insulating portion 19A, 19B, 32, 42A, 42B, 52 may be made of a dielectric material, for example, of silicon oxide ($SiO_2$), of silicon nitride, ($Si_xN_y$, where x is approximately equal to 3 and y is approximately equal to 4, for example, $Si_3N_4$), of silicon oxynitride (particularly of general formula $SiO_xN_y$, for example, $Si_2ON_2$) or of a material having a dielectric constant smaller, preferably by from 30% to 50%, than the dielectric constant of silicon oxide, particularly fluorine-doped silicon dioxide, carbon-doped silicon dioxide, porous silicon dioxide, or porous carbon doped silicon dioxide.

Each insulating portion 19A, 19B, 32, 42A, 42B, 52 may be formed by a deposition method, particularly a chemical vapor deposition method (CVD), particularly a plasma-enhanced chemical vapor deposition or PECVD, or also SACVD (surface activated chemical vapor deposition), for example, at temperatures in the range from 50 to 700° C. Each insulating portion 19A, 19B, 32, 42A, 42B, 52 may be formed by thermal oxidation, particularly at temperatures in the range from 700° C. to 1200° C., preferably from 1000° C. to 1100° C. Dry or wet thermal oxidation methods may be used. Preferably, each insulating portion 19A, 19B, 32, 42A, 42B, 52 is formed by thermal oxidation.

Each filling portion 34A, 34B, 44, 54A, 54B is made of a filling material. The filling material may correspond to the material forming substrate 6, particularly in polycrystalline form, or may be another material than that forming the substrate. It has as a first function to ensure the mechanical coherence of the optoelectronic circuit. More generally, filling material 20 may correspond to an electrically-insulating, semiconductor or electrically-conductive material. Filling portions 34A, 34B, 44, 54A, 54B are for example made of silicon, of germanium, of silicon carbide, of a III-V compound, such as GaN, InP, or GaAs, of a II-VI compound, for example ZnO, of tungsten (W), of copper (Cu), of glass based on oxides, particularly silicon oxide ($SiO_2$), sodium oxide ($Na_2O$), calcium oxide (CaO), or barium oxide ($B_2O_3$), or of a material having an organic base such as polyimide, epoxies, polyurethane, polynorbornenes, benzocyclobutene, polytetrafluoroethylene (PTFE, particularly Teflon), polyarylene, ethers, parylene, hydrogen silsesquioxane (HSQ), and methylsilsesquioxane (MSQ). Preferably, each portion 34A, 34B, 44, 54A, 54B is made of polysilicon. Preferably, each portion 34A, 34B, 44, 54A, 54B is made of a material compatible with manufacturing methods implemented in microelectronics. Each portion 34A, 34B, 44, 54A, 54B may be heavily-doped, lightly-doped, or non-doped.

FIGS. 6A to 6G are partial simplified cross-section views of structures obtained at successive steps of an embodiment of a method of manufacturing the electric insulation trench of electronic circuit 30 of FIG. 3.

Figure 6A:
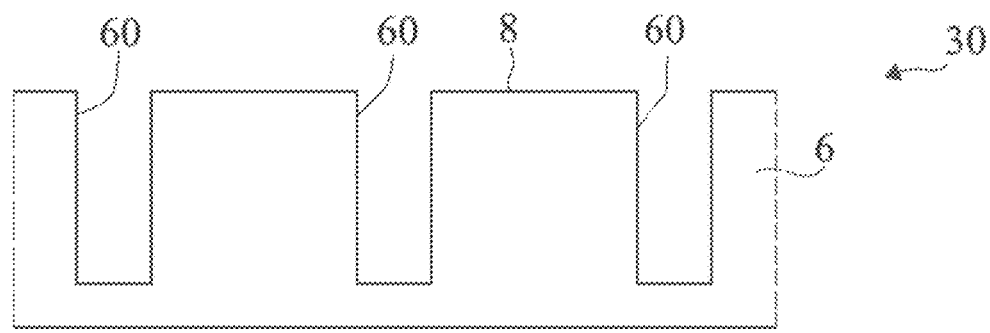
FIGS. 6A to 6G show the structures obtained at successive steps of an embodiment of a method of manufacturing the electronic circuit shown in FIG. 3.

FIG. 6A shows the structure obtained after the forming, for each trench, of an opening 60 extending in substrate 6 from surface 8 of substrate 6 at the desired location of the trench. The initial thickness of substrate 6 is greater than the desired final thickness of substrate 6. The width of opening 60, measured in a plane parallel to surface 8, is slightly smaller than the desired width E of the trench and the depth of opening 60 is greater than the desired final depth of the trench. Each opening 60 may be formed by photolithography steps, comprising the deposition of a resin layer on the upper surface, the forming of an opening in the resin layer on the desired location of opening 60, the etching of opening 60 in substrate 6 in continuation of the opening formed in the resin layer, and the removal of the resin layer. As an example, each opening 60 may be formed by dry etching. As a variation, as known in the state of the art, the prior deposition of a so-called "hard mask" stop layer may be used in addition to the photolithography resin.

Figure 6B:
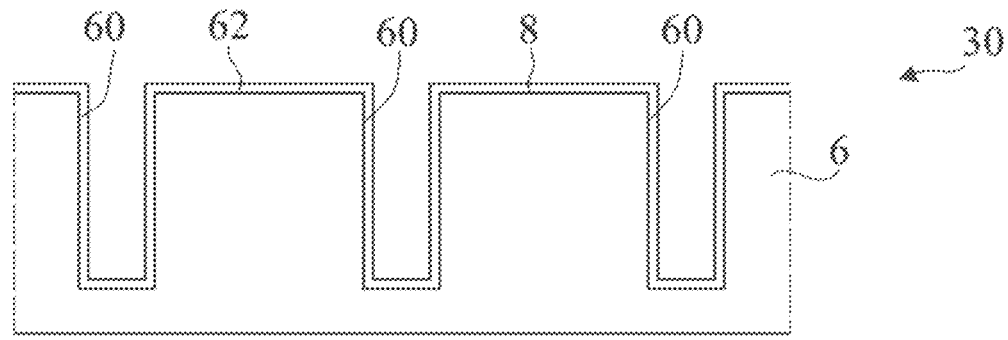

FIG. 6B shows the structure obtained after the forming of an electrically-insulating layer 62 on surface 8 and in opening 60. According to an embodiment, insulating layer 62 is formed by a thermal oxidation step. The thermal oxidation step is for example carried out between 1000° C. and 1100° C. The thermal oxidation method causes the transformation of a portion of substrate 6 into an oxide and thus a displacement of surface 8. As a variation, insulating layer 62 may be formed by a method of chemical vapor deposition type (CVD), particularly, plasma-enhanced chemical vapor deposition (PECVD), subatmospheric chemical vapor deposition (SACVD), or by other deposition and growth techniques such as thermal oxidation. Layer 62 may be made of one of the materials previously described for insulating portions 19A, 19B, 32, 42A, 42B, 52.

Figure 6C:
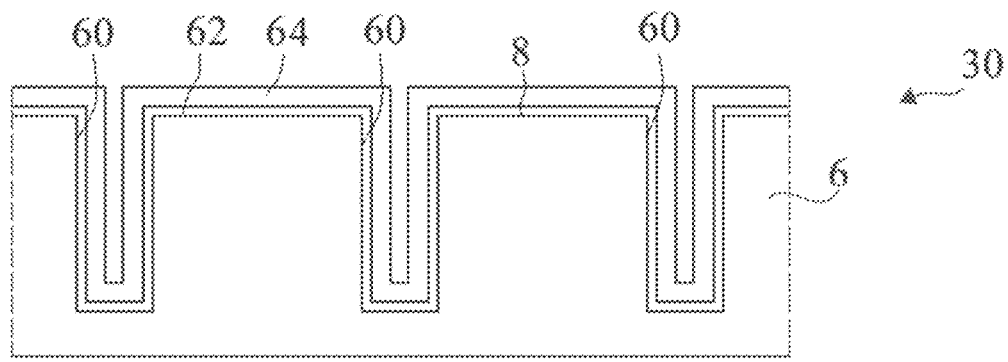

FIG. 6C shows the structure obtained after the deposition over the entire structure of a layer 64 of a filling material covering layer 62, particularly in each opening 60. The thickness of layer 64 is selected so that openings 60, covered with insulating layer 62, are not totally filled with the filling material. Layer 64 may be formed by CVD or PVD (physical vapor deposition), liquid phase deposition, deposition by printing techniques for organic materials, such as spin coating, silk-screening, spray, or inkjet. Layer 64 may be made of one of the materials previously described for filling portions 34A, 34B, 44, 54A, 54B.

Figure 6D:
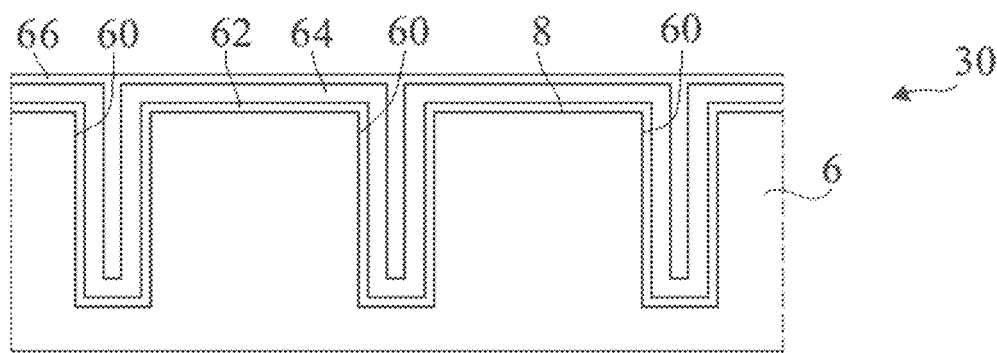

FIG. 6D shows the structure obtained after the forming of an electrically-insulating 66, for example, by one of the methods previously described for the forming of insulating layer 62, particularly, by a thermal oxidation step, on layer 64 and totally filling each opening 60. When a thermal oxidation method is implemented, the latter causes the transformation of a portion of layer 64 into an oxide. Layer 66 may be made of one of the materials previously described for insulating portions 19A, 19B, 32, 42A, 42B, 52. As a variation, the forming of electrically-insulating layer 66 may be achieved after a step of etching portions of layer 64 located outside of openings 60.

Figure 6E:
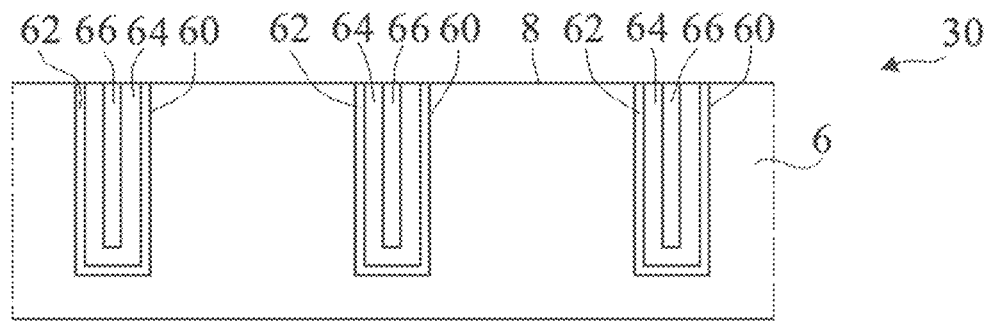

FIG. 6E shows the structure obtained after the etching of the portions of insulating layer 62, of the layer of filling material 64, and of insulating layer 66 outside of each opening 60 all the way to surface 8 to only keep the portions of insulating layer 62, of layer 64 of filling material, and of insulating layer 66 in each opening 60. The etch step may comprise a step of chemical mechanical polishing or CMP of insulating layer 62, of the layer of filling material 64, and of insulating layer 66 all the way to surface 8, and/or steps of dry or wet chemical etching, or also by physical etching of ion beam type.

Figure 6F:
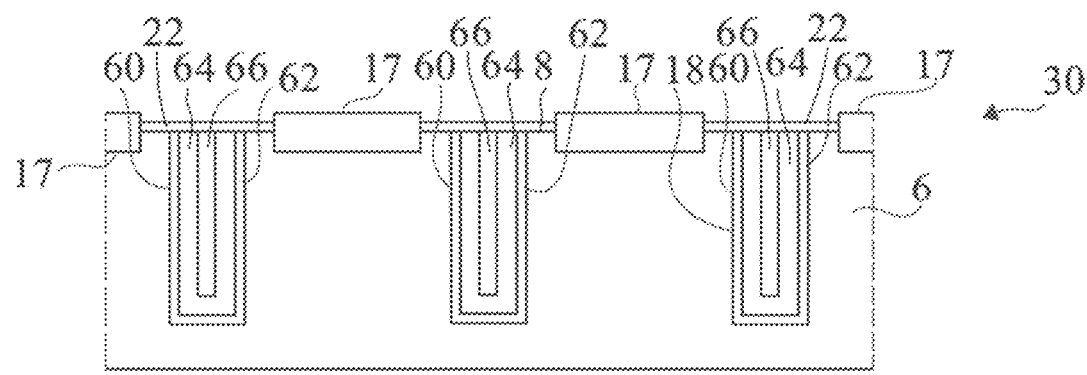

FIG. 6F shows the structure obtained after the carrying out of additional steps on the side of surface 8, for example comprising the forming of electronic components 17 and of insulating layer 22.

Figure 6G:
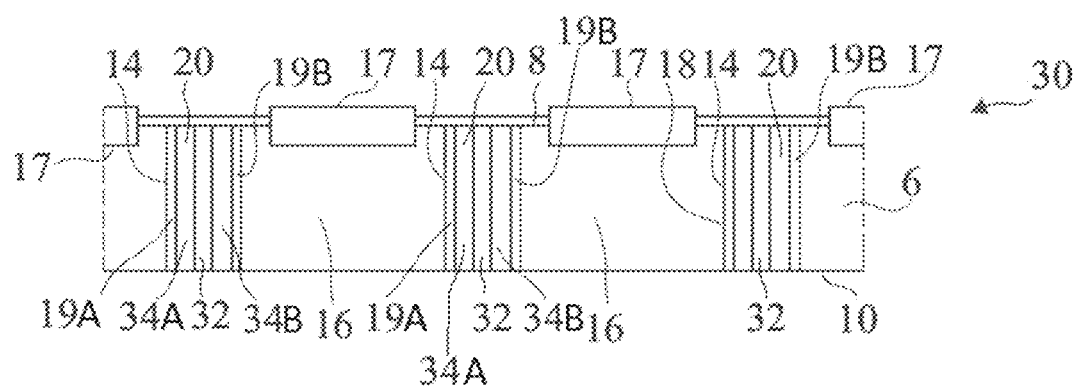

FIG. 6G shows the structure obtained after a step of thinning substrate 6 to reach insulating layer 66 in openings 60. The thinning step may comprise grinding steps, CMP steps, and/or also dry or wet etch steps. This step causes the delimiting of insulating portions 19A, 19B, of filling portions 34A, 34B, and of insulating portion 32. The step of thinning substrate 6 may require using a support, also called handle, temporarily or permanently fastened to substrate 6, on the side of surface 8 and enabling to manipulate substrate 6.

An embodiment of a method of manufacturing optoelectronic circuits 40 and 50 comprises the steps previously described in relation with FIGS. 6A to 6G, with the difference that steps 6B and 6C are repeated, once or more than once, to form the succession of insulating layers and of filling layers which, after the substrate thinning step, results in the desired structure of the electric insulation trenches.

Specific embodiments have been described. Various alterations, modifications, and improvements will readily occur to those skilled in the art. In particular, although, in the previously-described embodiments, trenches 12 are shown as being perpendicular to trenches 14, it should be clear that the trenches may have a different direction. As an example, portions 16 may have, in top view, a hexagonal cross-section. Further, various embodiments with different variations have been described hereabove. It should be noted that various elements of these various embodiments and variations may be combined.

The invention claimed is:

1. An electronic circuit comprising a semiconductor substrate having first and second opposite surfaces and electric insulation trenches extending in the substrate from the first surface to the second surface, each trench separating first and second portions of the substrate, each trench comprising:
   at least first and second electrically-insulating portions of a first electrically-insulating material extending from the first surface to the second surface;
   first and second intermediate portions extending from the first surface to the second surface, made of a first filling material different from the first electrically-insulating material;
   a third electrically-insulating portion extending from the first surface to the second surface, made of the first electrically-insulating material or of a second electrically-insulating material different from the first electrically-insulating material, the first electrically-insulating portion being in contact with the first intermediate portion, the second electrically-insulating portion being in contact with the second intermediate portion, and the third electrically-insulating portion being interposed between the first and second intermediate portions;
   a fourth electrically-insulating portion extending from the first surface to the second surface, made of the same material as the third electrically-insulating portion; and
   at least one third intermediate portion extending from the first surface to the second surface, made of the first filling material or of a second filling material different from the first filling material, the third electrically-insulating portion being in contact with the first intermediate portion, the fourth electrically-insulating portion being in contact with the second intermediate portion, and the third intermediate portion being interposed between the third and fourth electrically-insulating portions.

2. The electronic circuit of claim 1, wherein each trench further comprises:
   a fourth intermediate portion extending from the first surface to the second surface, made of the same material as the third intermediate portion, and
   at least one fifth electrically-insulating portion, extending from the first surface to the second surface, made of the first electrically-insulating material, of the second electrically-insulating material, or of a third electrically-insulating material different from the first and second electrically-insulating materials, the third intermediate portion being in contact with the third electrically-insulating portion, the fourth intermediate portion being in contact with the fourth electrically-insulating portion, and the fifth electrically-insulating portion being interposed between the third and fourth intermediate portions.

3. The electronic circuit of claim 1, wherein the first electrically-insulating material is selected from the group comprising silicon oxide, silicon nitride, silicon oxynitride, or is a material having a dielectric constant lower by at least 30% than the dielectric constant of silicon oxide, particularly fluorine-doped silicon dioxide, carbon-doped silicon dioxide, porous silicon dioxide, or porous carbon doped silicon dioxide.

4. The electronic circuit of claim 1, wherein the first filling material is selected from the group comprising silicon, germanium, silicon carbide, III-V compounds, II-VI compounds, tungsten, copper, oxide glasses, organic-based materials, or a mixture of at least two of these compounds.

5. The electronic circuit of claim 1, wherein the trenches delimit rows of portions of the substrate.

6. The electronic circuit of claim 1, wherein the thickness of the substrate is in the range from 2 µm to 500 µm.

7. The electronic circuit of claim 1, wherein the thickness of the first, second, and third electrically-insulating portions is in the range from 10 nm to 500 nm.

8. The electronic circuit of claim 1, wherein the thickness of the first and second intermediate portions is in the range from 235 nm to 2,000 nm.

9. A method of manufacturing an electronic circuit comprising the successive steps of:
   providing a semiconductor substrate having first and second opposite surfaces;
   forming openings in the substrate from the first surface across part of the substrate thickness;
   depositing a first electrically-insulating layer made of a first electrically-insulating material at least in each opening;
   depositing a first intermediate layer made of a first filling material different from the first electrically-insulating material at least in each opening in contact with the first electrically-insulating layer;
   depositing a second electrically-insulating layer made of the first electrically-insulating material or of a second electrically-insulating material different from the first electrically-insulating material at least in each opening in contact with the first intermediate layer;
   thinning the substrate from the second surface to bring the second surface closer to the first surface to reach at least the second electrically-insulating layer, thus delimiting electric insulation trenches extending in the substrate from the first surface to the second surface, each trench separating first and second portions of the substrate, each trench comprising at least first and second electrically-insulating layers of the first electrically-insulating material extending from the first surface to the second surface, first and second intermediate layers extending from the first surface to the second surface, made of the first filling material, and a third electrically-insulating layer extending from the first surface to the second surface, made of the first electrically-insulating material or of the second electrically-insulating material, the first electrically-insulating layer being in contact with the first intermediate layer, the second electrically-insulating layer being in contact with the second intermediate layer, and the third electrically-insulating layer being interposed between the first and second intermediate layers; and
   before the thinning step, depositing a second intermediate layer, made of the first filling material or of a second filling material different from the first filling material, at least in each opening in contact with the second electrically-insulating layer, each trench delimited at the thinning step further comprising a fourth electrically-insulating portion, extending from the first surface to the second surface, made of the same material as the third electrically-insulating portion and at least a third intermediate portion extending from the first surface to the second surface, made of the first filling material or of the second filling material, the third electrically-insulating portion being in contact with the first intermediate portion, the fourth electrically-insulating portion being in contact with the second intermediate portion, and the third intermediate portion being interposed between the third and fourth electrically-insulating portions.

10. A method of manufacturing an electronic circuit comprising the successive steps of:
 providing a semiconductor substrate having first and second opposite surfaces;
 forming openings in the substrate from the first surface across part of the substrate thickness;
 depositing a first electrically-insulating layer made of a first electrically-insulating material at least in each opening;
 depositing a first intermediate layer made of a first filling material different from the first electrically-insulating material at least in each opening in contact with the first electrically-insulating layer;
 depositing a second electrically-insulating layer made of the first electrically-insulating material or of a second electrically-insulating material different from the first electrically-insulating material at least in each opening in contact with the first intermediate layer and
 thinning the substrate from the second surface to bring the second surface closer to the first surface to reach at least the second electrically-insulating layer, thus delimiting electric insulation trenches extending in the substrate from the first surface to the second surface, each trench separating first and second portions of the substrate, each trench comprising at least first and second electrically-insulating layers of the first electrically-insulating material extending from the first surface to the second surface, first and second intermediate layers extending from the first surface to the second surface, made of the first filling material, and a third electrically-insulating layer extending from the first surface to the second surface, made of the first electrically-insulating material or of the second electrically-insulating material, the first electrically-insulating layer being in contact with the first intermediate layer, the second electrically-insulating layer being in contact with the second intermediate layer, and the third electrically-insulating layer being interposed between the first and second intermediate layers; and
 before the thinning step, depositing a third electrically-insulating layer, made of the first electrically-insulating material, of the second electrically-insulating material, or of a third electrically-insulating material different from the first and second electrically-insulating materials, at least in each opening, in contact with the second intermediate layer, each trench delimited at the thinning step further comprising a fourth intermediate portion, extending from the first surface to the second surface, made of the same material as the third intermediate portion, and at least a fifth electrically-insulating portion, extending from the first surface to the second surface, made of the first electrically-insulating material, of the second electrically-insulating material, or of the third electrically-insulating material, the third intermediate portion-being in contact with the third electrically-insulating portion, the fourth intermediate portion being in contact with the fourth electrically-insulating portion, and the fifth electrically-insulating portion being interposed between the third and fourth intermediate portions.

\* \* \* \* \*